United States Patent
Kuhnke et al.

(10) Patent No.: US 10,889,491 B2
(45) Date of Patent: Jan. 12, 2021

(54) METHOD FOR PRODUCING A MICROMECHANICAL ELEMENT

(71) Applicant: Robert Bosch GmbH, Stuttgart (DE)

(72) Inventors: Markus Kuhnke, Wannweil (DE); Heiko Stahl, Reutlingen (DE); Stefan Majoni, Weil im Schoenbuch (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/134,505

(22) Filed: Sep. 18, 2018

(65) Prior Publication Data

US 2019/0092628 A1 Mar. 28, 2019

(30) Foreign Application Priority Data

Sep. 25, 2017 (DE) .................. 10 2017 216 941

(51) Int. Cl.
*B81C 1/00* (2006.01)
*B81B 7/00* (2006.01)
*G01D 5/06* (2006.01)

(52) U.S. Cl.
CPC ........ *B81C 1/00293* (2013.01); *B81B 7/0041* (2013.01); *B81C 1/00333* (2013.01); *G01D 5/06* (2013.01); *B81C 2201/0132* (2013.01); *B81C 2203/0136* (2013.01); *B81C 2203/0145* (2013.01)

(58) Field of Classification Search
CPC ............. B81B 2201/0257; B81B 7/02; B81B 2201/0264; B81B 2201/0235; B81B 2203/0315

USPC ......................................................... 257/415
See application file for complete search history.

(56) References Cited

U.S. PATENT DOCUMENTS

| 2008/0128841 | A1  | 6/2008  | Fujimori et al. |
| 2013/0270658 | A1* | 10/2013 | Behrendt .............. B81B 3/0094 257/415 |
| 2016/0084865 | A1* | 3/2016  | Kaelberer ................. B81B 7/02 73/511 |
| 2016/0170882 | A1* | 6/2016  | Choi ..................... G06F 3/0647 711/119 |

(Continued)

FOREIGN PATENT DOCUMENTS

| DE | 10 2009 045 385 A1 | 4/2011 |
| DE | 10 2010 041 900 A1 | 4/2012 |

(Continued)

*Primary Examiner* — Andy Huynh
(74) *Attorney, Agent, or Firm* — Maginot, Moore & Beck LLP

(57) ABSTRACT

A method for producing a micromechanical element includes producing a micromechanical structure, the micromechanical structure having: a functional layer for a micromechanical element, a sacrifical layer at least partly surrounding the functional layer, and a closure cap on the sacrifical layer. The method further includes applying a cover layer on the micromechanical structure. The method further includes producing a grid structure in the cover layer. The method further includes producing a cavity below the grid structure, as access to the sacrifical layer. The method further includes at least partly removing the sacrifical layer. The method further includes applying a closure layer at least on the grid structure of the cover layer for the purpose of closing the access to the cavity.

7 Claims, 3 Drawing Sheets

(56) References Cited

U.S. PATENT DOCUMENTS

2017/0297911 A1* 10/2017 Shin ..................... B81B 3/0078

FOREIGN PATENT DOCUMENTS

| DE | 10 2012 219 605 A1 | 4/2014 |
| --- | --- | --- |
| DE | 10 2013 209 266 A1 | 11/2014 |

* cited by examiner

METHOD FOR PRODUCING A MICROMECHANICAL ELEMENT

This application claims priority under 35 U.S.C. § 119 to patent application number DE 10 2017 216 941.9, filed on Sep. 25, 2017 in Germany, the disclosure of which is incorporated herein by reference in its entirety.

BACKGROUND

The disclosure relates to a method for producing a micromechanical element.

The disclosure furthermore relates to a micromechanical structure.

Although the present disclosure is applicable to any micromechanical structures, the present disclosure is described with respect to micromechanical resonator structures.

Many micromechanical sensors and actuators use a defined internal pressure in a hollow space in which movable elements of the micromechanical sensor are situated, for example an oscillating structure of a micromechanical resonator. In the case of a micromechanical resonator, usually a movable structure is placed on silicon oxide or a similar material as sacrificial layer and is at least partly surrounded thereby. After a closure cap has been deposited, an access to the sacrificial layer is incorporated, for example by trenching access holes. A gas is then introduced through said access holes and removes the sacrificial layer, for example by etching. Said access holes are then closed again.

DE 10 2009 045 385 A1 has disclosed a method for closing at least one trench of a micromechanical or electrical component. The method comprises the following steps: applying a grid on the component above the trench to be formed, forming the trench below the grid, and closing the openings of the grid above the trench by depositing a filling layer onto the grid.

SUMMARY

In one embodiment, the disclosure provides a method for producing a micromechanical element, comprising the following steps:
producing a micromechanical structure, having a functional layer for a micromechanical element, a sacrificial layer at least partly surrounding the functional layer, and a closure cap on the sacrificial layer,
applying a cover layer on the micromechanical structure,
producing a grid structure in the cover layer,
producing a cavity below the grid structure, as access to the sacrificial layer,
at least partly removing the sacrificial layer,
applying a closure layer at least on the grid structure of the cover layer for the purpose of closing the access to the cavity.

In a further embodiment, the disclosure provides a micromechanical structure, comprising a cover layer which partly has a grid structure, a cavity in a closure cap material, wherein the grid structure is formed above the cavity, and a closure layer, wherein the closure layer is arranged at least on the grid structure of the cover layer for the purpose of closing the cavity, and also a functional layer for a micromechanical element, said functional layer being fluid-connected to the cavity.

One of the advantages achieved thereby is that, by way of example, an etching access is constricted by means of or with the aid of the gridlike structure and faster closure is thus made possible. By means of the grid structure, smaller interspaces are produced, which can be closed more simply, more cheaply and more rapidly. A shorter duration of the closure process enables the closure material of the closure layer to be deposited predominantly on the surface and not on the microelectromechanical sensor element in the cavity. Furthermore, a long process duration during the deposition of the closure material, if etching components, for example critical gases, are used, leads to a material removal in the functional layer.

The closure process is likewise facilitated since it is possible to use even closure materials which grow greatly in a vertical direction and only little in a lateral direction, in particular in the case of large openings. The flexibility in the choice of a closure material is thus increased. Further advantages are, for example, that by virtue of the grid structure the closure material to be applied on said grid structure contaminates the cavity to a lesser extent, or not at all, since the closure process can be carried out more rapidly and in a shorter time. Furthermore, it is possible to use a greater selection of closure materials, that is to say utilize in particular processes for closing the cavity which are carried out with expedient process or auxiliary gases, which in particular do not adversely affect the functional layer in the cavity, or adversely affect it to a lesser extent. The process reliability is likewise increased by virtue of the grid structure since the width or the diameter to be closed is reduced by virtue of the grid structure, or larger overall openings can be closed. A further advantage is that the gridlike structure enables a lower process pressure during the closure process, which enables a lower internal pressure in the cavity. This improves the quality of the micromechanical structure, and thus leads to a reduced power consumption in conjunction with better performance of the micromechanical sensor.

Further features, advantages and further embodiments of the disclosure are described hereinafter or become apparent therefrom:

In accordance with one advantageous development, removing the sacrificial layer is carried out by means of a vapor phase etching process. An advantage of this is that the sacrificial layer can be removed in a simple manner.

In accordance with a further advantageous development, producing the cavity is carried out by means of an etching method with overetching. This involves undercutting not only in a vertical direction but also at least partly laterally, which ensures a sufficient size of the cavity, and at the same time also reliably removes closure cap material below the webs of the grid.

In accordance with a further advantageous development, at least part of the material of the closure cap below the grid structure and corresponding to the latter is retained. In other words, a supporting structure is thereby formed below the grid or the grid structure, which overall increases the stability of the micromechanical structure.

In accordance with a further advantageous development, silicon oxide, silicon nitride, epitaxially grown silicon, polycrystalline silicon and/or a metal is used as material of the closure cap. By way of example, tungsten can be used as metal. It is thus possible to use various closure materials in flexible manner as necessary.

In accordance with a further advantageous development, a further closure layer, which is formed in gas-tight fashion, is applied on the applied closure layer. Said further closure layer can consist of metal, for example. By means of the further closure layer, in particular composed of metal, an additional diffusion barrier can be produced and/or compensation of stress in the micromechanical structure can be effected.

In accordance with a further advantageous development, corresponding to the grid structure, below the grid structure closure cap material is at least partly arranged in the cavity. An advantage of this is that a supporting structure for the grid structure is thereby formed, which improves the stability overall.

In accordance with a further advantageous development, a further closure layer, which is formed in gas-tight fashion, is arranged above the closure layer. By way of example, an additional diffusion barrier can be produced by means of the gas-tight closure layer.

In accordance with a further advantageous development, the functional layer comprises silicon and/or aluminum nitride. An advantage of this is that process and auxiliary gases during closure can be chosen flexibly. If the closure of the cavity is carried out by means of aluminum or tungsten, argon can be used as auxiliary gas, for example. If the closure of the cavity is carried out by means of silicon oxide, it is possible for example to use monosilan as process gas and oxygen as auxiliary gas. If epitaxially grown silicon is used as closure material of the cavity, it is possible to use silane, dichlorosilane or the like as process gas and hydrogen or hydrogen chloride as auxiliary gas.

Further important features and advantages of the disclosure are evident from the drawings and from the associated description of figures with reference to the drawings.

It goes without saying that the features mentioned above and those yet to be explained below can be used not only in the combination respectively indicated, but also in other combinations or by themselves, without departing from the scope of the present disclosure.

Preferred implementations and embodiments of the disclosure are illustrated in the drawings and are explained in greater detail in the following description, wherein identical reference signs refer to identical or similar or functionally identical component parts or elements.

DETAILED DESCRIPTION

Figure 1:
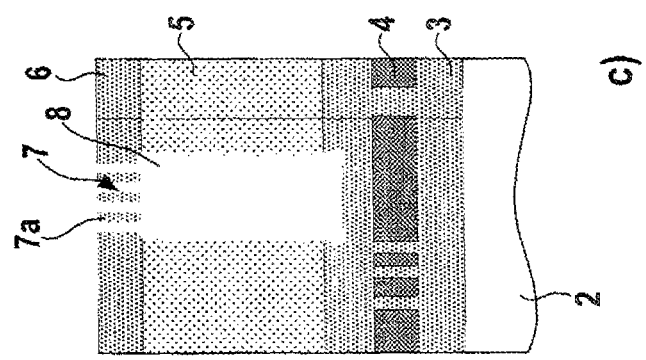
FIGS. 1a-e show steps of a method in accordance with one embodiment of the present disclosure.
Figure 1:
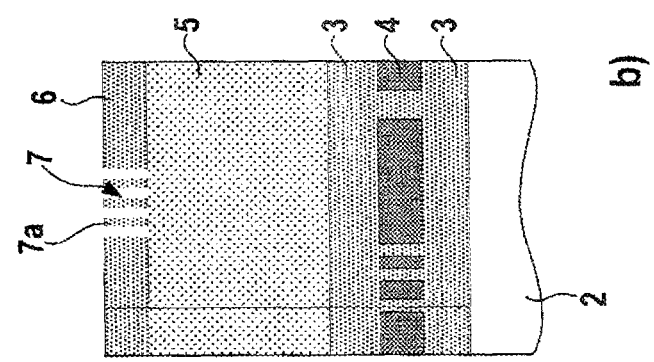
Figure 1:
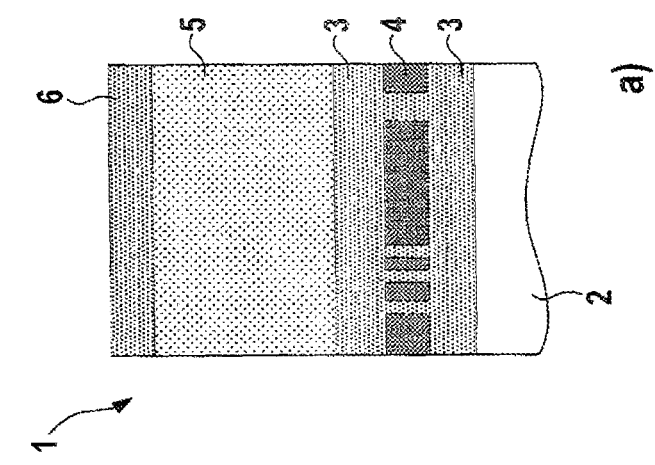
Figure 1:
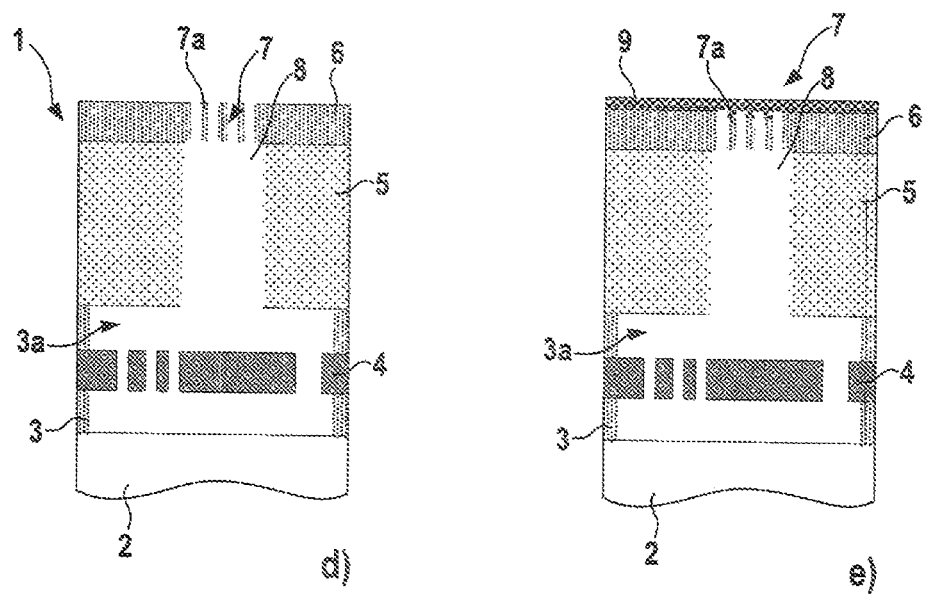

FIGS. 1a-e show steps of a method in accordance with one embodiment of the present disclosure.

In detail, FIG. 1a shows a micromechanical structure 1 comprising a plurality of layers one above another. The bottommost layer 2 is formed by a substrate. A sacrificial layer 3, for example produced from silicon oxide, is arranged on said substrate layer 2, a functional layer 4 for a microelectromechanical sensor being embedded into said sacrificial layer. A closure cap layer 5, for example in the form of a cap, is arranged above the sacrificial layer 3. Grid material 6 has in turn been applied or deposited on said closure cap layer 5.

In order to produce the micromechanical layer structure 1, for example the functional layer 4 is produced on the sacrificial layer 3 and then material of the sacrificial layer 3 is once again applied on the functional layer 4 until the part of the functional layer 4 which forms the micromechanical sensor is completely enclosed by the sacrificial layer 3. Afterward, a closure cover/cap 5, for example composed of epitaxially grown silicon, is deposited onto the sacrificial layer 3. The grid material 6 is then deposited onto the closure cover 5.

In a further step in accordance with FIG. 1b, a grid structure 7 is then structured into the grid material 6, in particular in the region of a cavity 8 yet to be produced.

In a further step in accordance with FIG. 1c, an etching process is then carried out via the grid structure 7 in order to produce a cavity 8 in the closure cover 5 and in order to obtain a fluidic access to the sacrificial layer 3.

In a further step in accordance with FIG. 1d, the sacrificial layer 3 is then removed in the region of the functional layer 4 (freed region 3a) in order to free the microelectromechanical sensor of the functional layer 4. This is carried out by means of a vapor phase etching process via or with the aid of the grid structure 7.

In a further step in accordance with FIG. 1e, a closure material 9 is then applied on the grid structure 7 and on the cover layer 6 in order to close the cavity 8 produced. For the closure or as closure material 9, use is preferably made of a material which deposits predominantly at the surface, does not contain aggressive chemical components or process gases which are critical for the respective microelectromechanical sensor element of the functional layer 4, and/or provides principally lateral growth.

Figure 2:
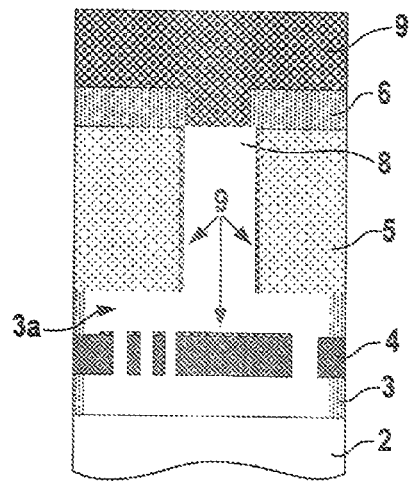
FIG. 2 shows a micromechanical structure, produced by a method already known.

FIG. 2 shows a micromechanical structure, produced according to a method already known. In detail, FIG. 2 shows substantially the same construction of the layers 2, 3, 4, 5 and 6 of the micromechanical structure 1 in accordance with FIG. 1. In contrast to the micromechanical structure 1 in accordance with FIG. 1, in the case of the micromechanical structure 1 in accordance with FIG. 2 the cover layer 6 is not provided with a grid structure 7. Likewise, the thickness of the closure material 9, or of the closure layer 9 above the cover layer 6, is greater than that of the micromechanical structure 1 in accordance with FIG. 1, since on account of the absent grid structure 7 of the micromechanical structure 1 in accordance with FIG. 2 it is necessary to close a single and larger access hole in the cover layer 6 for the cavity 8. Furthermore, on account of the absent grid structure 7, in particular, closure material 9 is introduced into the cavity 8 and onto the functional layer 4, which is disadvantageous for the quality of the micromechanical structure 1 in accordance with FIG. 2. This introduction of closure material 9 disadvantageously alters in particular the mechanical properties of the functional layer 4.

Figure 3:
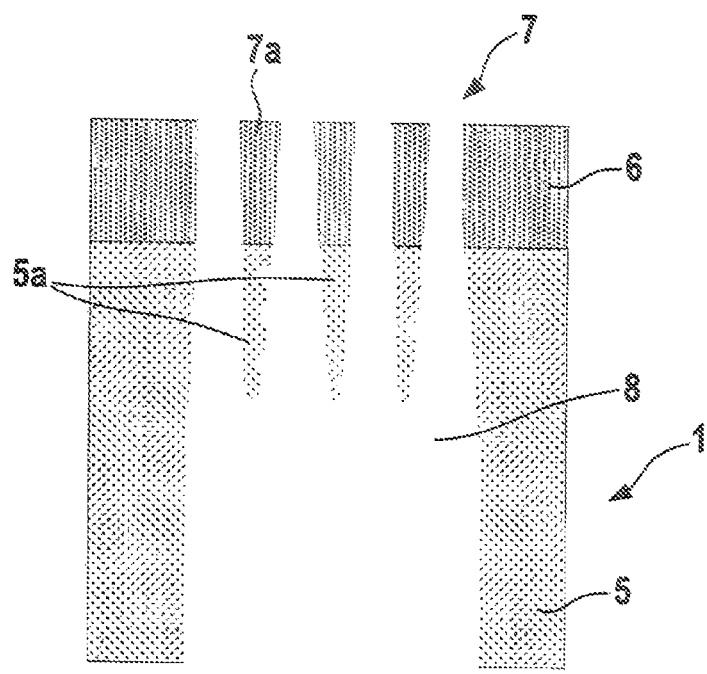
FIG. 3 shows a part of a micromechanical structure, produced by a method in accordance with one embodiment of the present disclosure.

FIG. 3 shows a part of a micromechanical structure, produced by a method in accordance with one embodiment of the present disclosure.

In detail, FIG. 3 shows the upper part of the layer structure 1 in accordance with FIG. 1e. In contrast to the micromechanical layer structure 1 in accordance with FIG. 1e, the micromechanical structure 1 in accordance with FIG. 3 now exhibits closure cap material 5a below the grid structure 7, more precisely below the beams 7a. The closure cap material 5a in this case extends in the direction of the functional layer 4 and in this case tapers over a certain distance into the cavity 8. In this way, a supporting structure is formed, which increases the mechanical stability. In this case, the closure cap material 7a extends into the cavity substantially to a maximum of 25%, preferably to a maximum of 10%, in particular to a maximum of 5%, of the depth of said cavity 8.

Figure 4:
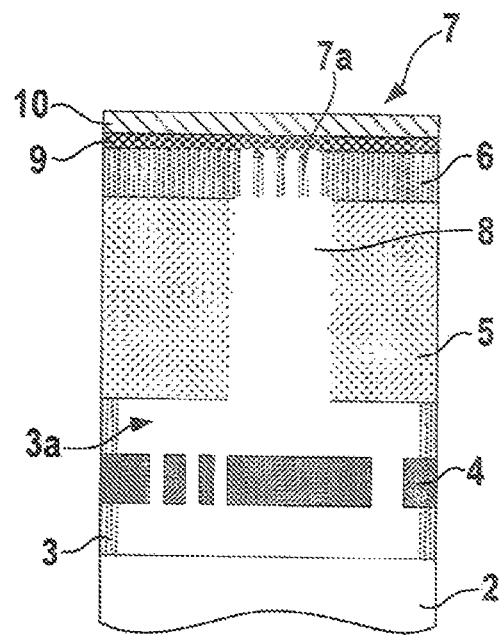
FIG. 4 shows a part of a micromechanical structure, produced by a method in accordance with one embodiment of the present disclosure.

FIG. 4 shows a part of a micromechanical structure produced by a method in accordance with one embodiment of the present disclosure.

In detail, FIG. 4 shows essentially the micromechanical structure 1 in accordance with FIG. 1e. In contrast to the micromechanical structure 1 in accordance with FIG. 1e, the micromechanical structure 1 in accordance with FIG. 4 has a further closure layer 10 on the closure layer 9. In this regard, by way of example, if silicon oxide is used as closure material for the closure layer 9, a gas-tightness can be produced by the second closure layer 10. A metal can be used as material for the second closure layer 10.

To summarize, the present disclosure, in particular at least one of its embodiments, has at least one of the following advantages:

faster closure process
less contamination of the cavity by closure material
free choice of the closure material with favorable process or auxiliary gases
during the closure process
greater process reliability during the closure of the cavity
improved quality of the micromechanical structure.

Although the present disclosure has been described on the basis of preferred exemplary embodiments, it is not restricted thereto, but rather can be modified in diverse ways.

What is claimed is:

1. A method for producing a micromechanical element, the method comprising:
   producing a micromechanical structure having a functional layer for a micromechanical element, a sacrificial layer at least partially above the functional layer and at least partly surrounding the functional layer, and a closure cap on an upper surface of the sacrificial layer;
   applying a cover layer on an upper surface of the closure cap of the micromechanical structure;
   producing a grid structure in the cover layer;
   producing a cavity in the closure cap below the grid structure, as access to the sacrificial layer;
   at least partly removing the sacrificial layer; and
   applying a closure layer at least on the grid structure of the cover layer to close the access to the cavity.

2. The method according to claim 1, wherein at least partly removing the sacrificial layer is carried out by a vapor phase etching process.

3. The method according to claim 2, wherein at least one of silicon oxide, silicon nitride, epitaxially grown silicon, polycrystalline silicon, and a metal is used as material of the closure cap.

4. The method according to claim 1, wherein producing the cavity is carried out by an etching method with over-etching.

5. The method according to claim 1, wherein the cavity is produced such that at least part of the material of the closure cap below the grid structure and corresponding to the grid structure is retained.

6. The method according to claim 1, further comprising:
   applying a further closure layer, which is formed in gas-tight fashion, on the applied closure layer.

7. A method for producing a micromechanical element, the method comprising:
   producing a micromechanical structure having a functional layer for a micromechanical element, a sacrificial layer at least partly surrounding the functional layer, and a closure cap on the sacrificial layer;
   applying a cover layer on the micromechanical structure;
   producing a grid structure in the cover layer;
   producing a cavity in the closure cap below the grid structure, as access to the sacrificial layer, wherein the cavity is produced such that at least part of the material of the closure cap below the grid structure and corresponding to the grid structure is retained;
   at least partly removing the sacrificial layer; and
   applying a closure layer at least on the grid structure of the cover layer to close the access to the cavity.

\* \* \* \* \*